(12) United States Patent
Dai

(10) Patent No.: US 12,224,292 B2
(45) Date of Patent: Feb. 11, 2025

(54) ARRAY SUBSTRATE, DISPLAY PANEL, AND MANUFACTURING METHOD OF ARRAY SUBSTRATE

(71) Applicant: Shenzhen China Star Optoelectronics Semiconductor Display Technology Co., Ltd., Guangdong (CN)

(72) Inventor: Chen Dai, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 288 days.

(21) Appl. No.: 17/624,033

(22) PCT Filed: Dec. 27, 2021

(86) PCT No.: PCT/CN2021/141568
§ 371 (c)(1),
(2) Date: Dec. 30, 2021

(87) PCT Pub. No.: WO2023/108811
PCT Pub. Date: Jun. 22, 2023

(65) Prior Publication Data
US 2023/0197738 A1    Jun. 22, 2023

(30) Foreign Application Priority Data
Dec. 17, 2021   (CN) .......................... 202111554193.1

(51) Int. Cl.
*H01L 27/12* (2006.01)

(52) U.S. Cl.
CPC ...... *H01L 27/1251* (2013.01); *H01L 27/1225* (2013.01); *H01L 27/1262* (2013.01)

(58) Field of Classification Search
CPC ............ H01L 27/1251; H01L 27/1225; H01L 27/1262; H01L 27/1248; H01L 29/78648
See application file for complete search history.

(56) References Cited

U.S. PATENT DOCUMENTS

2021/0083071 A1* 3/2021 Gui ....................... H01L 29/401

FOREIGN PATENT DOCUMENTS

| CN | 206584934 U | 10/2017 |
|---|---|---|
| CN | 109300915 A | 2/2019 |

(Continued)

OTHER PUBLICATIONS

International Search Report in International application No. PCT/CN2021/141568,mailed on Aug. 1, 2022.

(Continued)

*Primary Examiner* — Elias Ullah
(74) *Attorney, Agent, or Firm* — Rivka Friedman

(57) ABSTRACT

An array substrate, a display panel, and a manufacturing method of the array substrate are disclosed. The array substrate includes a substrate and a thin film transistor layer. The thin film transistor layer includes a first thin film transistor, and the first thin film transistor includes a first active layer, a first gate insulating layer, a first source and drain electrode layer, and a first gate electrode disposed on a same layer as the first source and drain electrode layer. Disposing the first gate electrode on the same layer as the first source and drain electrode layer can simplify manufacturing processes.

18 Claims, 3 Drawing Sheets

(56) References Cited

FOREIGN PATENT DOCUMENTS

| | | |
|---|---|---|
| CN | 111755464 A | 10/2020 |
| CN | 213071138 U | 4/2021 |
| CN | 113192978 A | 7/2021 |

OTHER PUBLICATIONS

Written Opinion of the International Search Authority in International application No. PCT/CN2021/141568, mailed on Aug. 1, 2022.

\* cited by examiner

ARRAY SUBSTRATE, DISPLAY PANEL, AND MANUFACTURING METHOD OF ARRAY SUBSTRATE

FIELD OF INVENTION

The present disclosure relates to the field of display technologies, and more particularly, to an array substrate, a display panel, and a manufacturing method of the array substrate.

BACKGROUND OF INVENTION

With development of display technologies, display panels, which have advantages of high image quality, power saving, thinness, and wide application range, have gradually become a mainstream of display devices. Thin film transistors (TFTs) are main driving elements in the display panels, which are directly related to a development direction of high-performance display panels.

The thin film transistors may be divided into amorphous silicon (a-Si) TFTs, low temperature polysilicon (LTPS) TFTs, and metal oxide TFTs according to differences of materials of active layers. Different types of thin film transistors have their own unique advantages, so display effect of the display panels can be effectively improved by using various thin film transistors to form mixed TFT structures. However, in current technology, manufacturing processes of array substrates having structures of mixed thin film transistors are complicated, so a production efficiency of the array substrates is low and a production cost thereof is high.

Technical problem: an embodiment of the present disclosure provides an array substrate, a display panel, and a manufacturing method of the array substrate to solve a problem of the low production efficiency caused by a complicated manufacturing process of the array substrates in current technology.

SUMMARY OF INVENTION

An embodiment of the present disclosure provides an array substrate, which includes:

a substrate; and a thin film transistor layer disposed on the substrate; wherein, the thin film transistor layer includes a first thin film transistor, and the first thin film transistor includes a first active layer, a first gate insulating layer, and a first source and drain electrode layer disposed in a stack on the substrate; the first gate insulating layer is disposed between the first active layer and the first source and drain electrode layer, and the first source and drain electrode layer includes a first source electrode and a first drain electrode electrically connected to the first active layer; and the first thin film transistor further includes a first gate electrode disposed on the first gate insulating layer, and the first gate electrode and the first source and drain electrode layer are disposed on a same layer.

Optionally, in some embodiments of the present disclosure, the first active layer, the first gate insulating layer, and the first source and drain electrode layer are disposed in sequence in a direction away from the substrate.

Optionally, in some embodiments of the present disclosure, gaps are defined between the first gate electrode and the first source electrode and between the first gate electrode and the first drain electrode, and the first gate insulating layer corresponding to the gaps is defined with first vias.

Optionally, in some embodiments of the present disclosure, the array substrate further includes a planarization layer disposed on the first source and drain electrode layer and the first gate electrode and filled in the gaps and the first vias.

Optionally, in some embodiments of the present disclosure, the first thin film transistor further includes a second gate electrode and an interlayer insulating layer, the second gate electrode is disposed on one side of the first active layer adjacent to the substrate, and the interlayer insulating layer is disposed between the first active layer and the second gate electrode.

Optionally, in some embodiments of the present disclosure, the array substrate further includes a second thin film transistor disposed in parallel with the first thin film transistor on the substrate; wherein, the second thin film transistor includes a second active layer, the first gate insulating layer, and a second source and drain electrode layer disposed in a stack on the substrate; the first gate insulating layer is disposed between the second active layer and the second source and drain electrode layer, and the second source and drain electrode layer includes a second source electrode and a second drain electrode electrically connected to the second active layer; and the second source and drain electrode layer, the first source and drain electrode layer, and the first gate electrode are disposed on the same layer.

Optionally, in some embodiments of the present disclosure, the second active layer, the first gate insulating layer, and the second source and drain electrode layer are disposed in sequence in a direction away from the substrate.

Optionally, in some embodiments of the present disclosure, the first gate insulating layer corresponding to the first source electrode is defined with a second via, the second via exposes the second active layer, and the first source electrode is electrically connected to the second active layer by the second via.

Optionally, in some embodiments of the present disclosure, the second thin film transistor includes a third gate electrode and a second gate insulating layer, the third gate electrode is disposed corresponding to the second active layer, and the second gate insulating layer is disposed between the third gate electrode and the second active layer; and the third gate electrode is disposed on one side of the second active layer away from the substrate or on one side of the second active layer adjacent to the substrate.

Optionally, in some embodiments of the present disclosure, the array substrate further includes a light shielding metal layer disposed on the side of the second active layer adjacent to the substrate.

Optionally, in some embodiments of the present disclosure, the third gate electrode is disposed on a same layer as the second gate electrode or with the first source and drain electrode layer.

Optionally, in some embodiments of the present disclosure, the second thin film transistor further includes a fourth gate electrode and a third gate insulating layer, the third gate insulating layer is disposed between the third gate electrode and the fourth gate electrode, and the fourth gate electrode is disposed corresponding to the second active layer.

Optionally, in some embodiments of the present disclosure, the third gate electrode and the fourth gate electrode are disposed on the side of the second active layer away from the substrate, or at least one of the third gate electrode or the fourth gate electrode is disposed on the side of the second active layer adjacent to the substrate.

Optionally, in some embodiments of the present disclosure, a material of the first active layer includes one or more of indium gallium zinc oxide, indium tin oxide, or indium zinc oxide, and a material of the second active layer includes low temperature polysilicon.

Correspondingly, an embodiment of the present disclosure further provides a display panel, which includes any one of the array substrates mentioned above.

Correspondingly, an embodiment of the present disclosure further provides a manufacturing method of an array substrate, which includes following steps:

providing a substrate;

disposing a first active layer and a first gate insulating layer in sequence on the substrate; and forming a first gate electrode, a first source electrode, and a first drain electrode on the first gate insulating layer and allowing the first source electrode and the first drain electrode to be electrically connected to the first active layer, wherein, the first active layer, the first gate insulating layer, the first gate electrode, the first source electrode, and the first drain electrode form a first thin film transistor.

Optionally, in some embodiments of the present disclosure, the step of disposing the first active layer and the first gate insulating layer in sequence on the substrate includes following steps:

disposing a second active layer and a second gate insulating layer in sequence on the substrate;

forming a second gate electrode and a third gate electrode on the second gate insulating layer and allowing the third gate electrode to correspond to the second active layer;

disposing an interlayer insulating layer on the second gate electrode and the third gate electrode;

forming the first active layer on the interlayer insulating layer corresponding to the second gate electrode; and disposing the first gate insulating layer on the first active layer.

Optionally, in some embodiments of the present disclosure, the step of forming the first gate electrode, the first source electrode, and the first drain electrode on the first gate insulating layer includes following steps:

forming the first gate electrode, the first source electrode, the first drain electrode, a second source electrode, and a second drain electrode on the first gate insulating layer, allowing the first source electrode and the first drain electrode to be electrically connected to the first active layer, and allowing the first source electrode, the second source electrode, and the second drain electrode to be electrically connected to the second active layer, wherein, the second active layer, the second gate insulating layer, the third gate electrode, the first gate insulating layer, the second source electrode, and the second drain electrode form a second thin film transistor.

Optionally, in some embodiments of the present disclosure, the method further includes a following step:

disposing a planarization layer on the first gate electrode, the first source electrode, the first drain electrode, the second source electrode, and the second drain electrode.

Optionally, in some embodiments of the present disclosure, before the step of disposing the second active layer and the second gate insulating layer in sequence on the substrate, the method further includes following steps:

disposing a light shielding metal layer on the substrate; and disposing a buffer layer on the light shielding metal layer.

Beneficial effect: in the embodiments of the present disclosure, the array substrate includes the substrate and the thin film transistor layer, and the thin film transistor layer includes the first thin film transistor. The first thin film transistor includes the first active layer, the first gate insulating layer, the first source and drain electrode layer, and the first gate electrode. Wherein, the first source and drain electrode layer includes the first source electrode and the first drain electrode electrically connected to the first active layer, and the first gate electrode and the first source and drain electrode layer are disposed on the same layer. By disposing the first gate electrode and the first source and drain electrode layer on the same layer, the first gate electrode, the first source electrode, and the first drain electrode can be manufactured at a same time by a same mask during a manufacturing process. Therefore, the manufacturing process of the array substrate can be simplified, production efficiency of the array substrate can be improved, and production costs can be reduced.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

Figure 1:
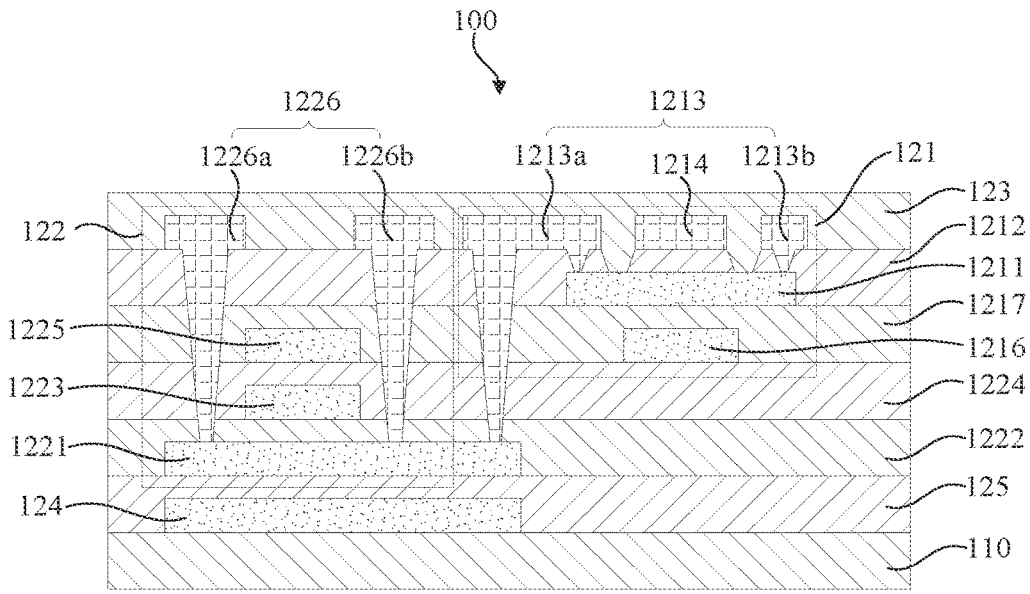
FIG. 1 is a schematic structural diagram of an array substrate according to an embodiment of the present disclosure.

Elements in the drawings are designated by reference numerals listed below.

| reference numeral | element | reference numeral | element |
|---|---|---|---|
| 10 | display panel | 1216 | second gate electrode |
| 100 | array substrate | 1217 | interlayer insulating layer |
| 110 | substrate | 122 | second thin film transistor |
| 120 | thin film transistor layer | 1221 | second active layer |
| 121 | first thin film transistor | 1222 | second gate insulating layer |
| 1211 | first active layer | 1223 | third gate electrode |
| 1212 | first gate insulating layer | 1224 | third gate insulating layer |
| 1212a | first via | 1225 | fourth gate electrode |
| 1212b | second via | 1226 | second source and drain electrode layer |
| 1212c | third via | 1226a | second source electrode |
| 1212d | fourth via | 1226b | second drain |

-continued

| reference numeral | element | reference numeral | element |
|---|---|---|---|
| 1213 | first source and drain electrode layer | 123 | electrode planarization layer |
| 1213a | first source electrode | 124 | light shielding metal layer |
| 1213b | first drain electrode | 125 | buffer layer |
| 1214 | first gate electrode | 200 | light-emitting device |
| 1215 | gap | 300 | encapsulating component |

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refers to the outline of the device.

The embodiments of the present disclosure provide an array substrate, a display panel, and a manufacturing method of the array substrate. They will be described in detail in the following. It should be noted that an order of description in the following embodiments is not meant to limit a preferred order of the embodiments.

Figure 5:
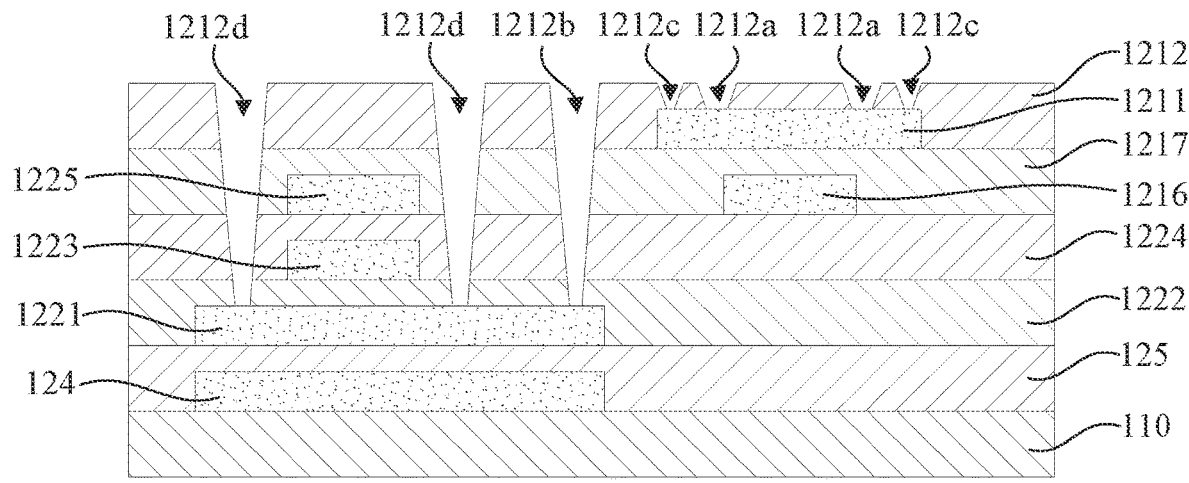
FIG. 5 is a schematic structural diagram of the array substrate in the step S200 in FIG. 3 according to an embodiment of the present disclosure.
Figure 6:
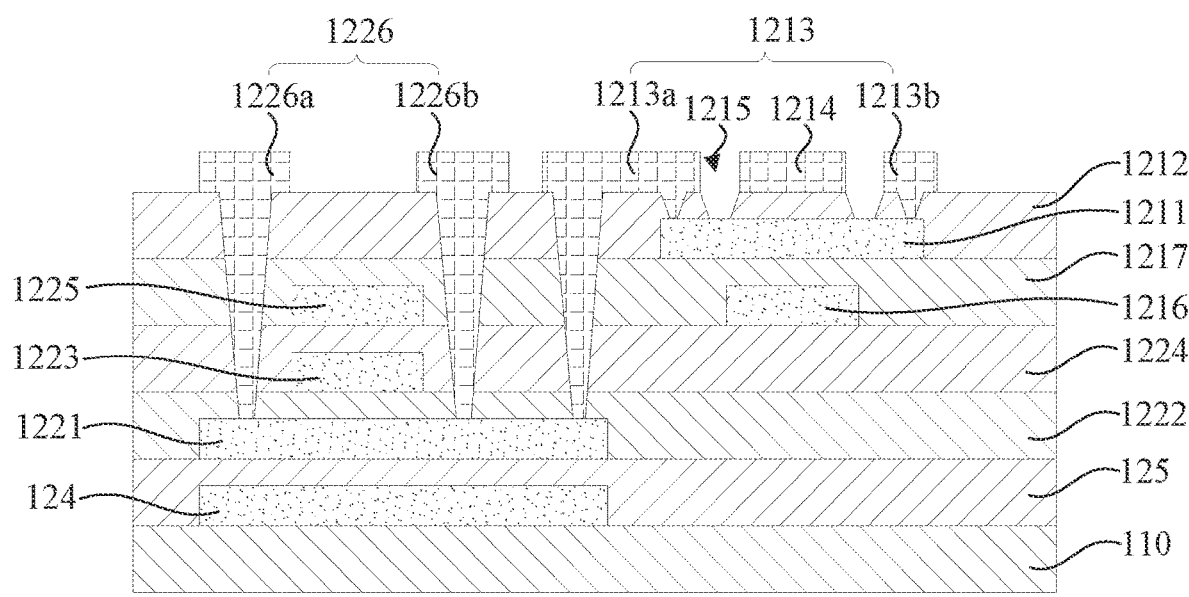
FIG. 6 is a schematic structural diagram of the array substrate in a step S300 in FIG. 3 according to an embodiment of the present disclosure.

First, an embodiment of the present disclosure provides an array substrate. As shown in FIGS. 1, 5, and 6, the array substrate 100 includes a substrate 110, and the substrate 110 is used as a supporting structure in the array substrate 100 to support other film structures on the array substrate 100, thereby maintaining relative stability of the array substrate 100. Wherein, the substrate 110 may be a glass substrate, a hard substrate of other materials, or a flexible substrate, and is not limited herein.

The array substrate 100 includes a thin film transistor layer 120 disposed on the substrate 110, and the thin film transistor layer 120 is used as a switch control structure of the array substrate 100 and is configured to control other functional layer structures disposed on the array substrate 100 to satisfy different application requirements.

Wherein, the thin film transistor layer 120 includes a first thin film transistor 121, and the first thin film transistor 121 includes a first active layer 1211, a first gate insulating layer 1212, and a first source and drain electrode layer 1213 disposed in a stack on the substrate 110. The first gate insulating layer 1212 is disposed between the first active layer 1211 and the first source and drain electrode layer 1213 to separate the first active layer 1211 from the first source and drain electrode layer 1213, thereby being convenient for a design of connecting the first source and drain electrode layer 1213 to the first active layer 1211.

It should be noted that the first active layer 1211, the first gate insulating layer 1212, and the first source and drain electrode layer 1213 are disposed in sequence in a direction away from the substrate 110, or the first source and drain electrode layer 1213, the first gate insulating layer 1212, and the first active layer 1211 are disposed in sequence in the direction away from the substrate 110. That is, positions of the first active layer 1211 and the first source and drain electrode layer 1213 relative to the substrate 110 may be exchanged, and a specific setting method can be adjusted according to actual design requirements.

Wherein, the first source and drain electrode layer 1213 includes a first source electrode 1213a and a first drain electrode 1213b that are electrically connected to the first active layer 1211. Turning on and off of the first active layer 1211 that is connected between the first source electrode 1213a and the first drain electrode 1213b can be realized by electrically connecting the first source electrode 1213a and the first drain electrode 1213b to the first active layer 1211 and adjusting driving voltages of the first source electrode 1213a and the first drain electrode 1213b, thereby realizing controlling other functional layer structures disposed on the array substrate 100.

Optionally, the first thin film transistor 121 further includes a first gate electrode 1214 disposed on the first gate insulating layer 1212. The first gate electrode 1214 is used as a switch structure, and the first thin film transistor 121 can be turned on or off by adjusting a driving voltage of an input terminal of the first gate electrode 1214, so the first thin film transistor 121 can regulate other functional structures.

Wherein, the first gate electrode 1214 and the first source and drain electrode layer 1213 are disposed on a same layer. That is, the first gate electrode 1214 and the first source and drain electrode layer 1213 belong to a same metal layer, that is, the first gate electrode 1214, the first source electrode 1213a, and the first drain electrode 1213b are disposed on the same layer. This structural setting method allows the first gate electrode 1214 and the first source electrode 1213a and the first drain electrode 1213b of the first source and drain electrode layer 1213 can be manufactured at a same time by a same mask during the manufacturing process. Therefore, one mask can be omitted, the manufacturing process of the array substrate 100 can be simplified, production efficiency of the array substrate 100 can be improved, and production costs can be reduced.

In the embodiment of the present disclosure, the array substrate 100 includes the substrate 110 and the thin film transistor layer 120. The thin film transistor layer 120 includes the first thin film transistor 121, and the first thin film transistor 121 includes the first active layer 1211, the first gate insulating layer 1212, the first source and drain electrode layer 1213, and the first gate electrode 1214. Wherein, the first source and drain electrode layer 1213 includes the first source electrode 1213a and the first drain electrode 1213b electrically connected to the first active layer 1211, and the first gate electrode 1214 and the first source and drain electrode layer 1213 are disposed on the same layer. By disposing the first gate electrode 1214 and the first source and drain electrode layer 1213 on the same layer, the first gate electrode 1214, the first source electrode 1213a, and the first drain electrode 1213b can be manufactured at the same time by the same mask during the manufacturing process. Therefore, the manufacturing process of the array substrate 100 can be simplified, the production efficiency of the array substrate 100 can be improved, and the production costs can be reduced.

Optionally, gaps 1215 are defined between the first gate electrode 1214 and the first source electrode 1213a and between the first gate electrode 1214 and the first drain electrode 1213b. That is, the first gate electrode 1214, the first source electrode 1213a, and the first drain electrode 1213b are disposed at intervals. Therefore, the first gate electrode 1214, the first source electrode 1213a, and the first drain electrode 1213b can prevent mutual interference, thereby affecting normal turning on and off of the first thin film transistor 121.

Wherein, the first gate insulating layer 1212 corresponding to the gaps 1215 is provided with first vias 1212a, thereby ensuring that the first gate electrode 1214 can be completely separated from the first source electrode 1213a and the first drain electrode 1213b. Incomplete etching caused by etching accuracy or etching depths during the manufacturing process of the array substrate 100, which makes interference occur between the first gate electrode 1214 and the first source electrode 1213a and the first drain electrode 1213b, can be prevented, thereby ensuring structural stability of the first thin film transistor 121.

Optionally, the array substrate 100 includes a planarization layer 123 disposed on the first source and drain electrode layer 1213 and the first gate electrode 1214, and the planarization layer 123 is filled in the gaps 1215 among the first gate electrode 1214, the first source electrode 1213a, and the first drain electrode 1213b, and the first vias 1212a on the first gate insulating layer 1212. By disposing the planarization layer 123, a surface of the array substrate 100 can be flattened to facilitate connection between the array substrate 100 and subsequent functional layer structures, and electrical insulation between the first gate electrode 1214, and the first source electrode 1213a and the first drain electrode 1213b can be improved, thereby preventing mutual interference, and improving the structural stability of the first thin film transistor 121.

Optionally, the first thin film transistor 121 further includes a second gate electrode 1216 and an interlayer insulating layer 1217, the second gate electrode 1216 is disposed on one side of the first active layer 1211 adjacent to the substrate 110, and the interlayer insulating layer 1217 is disposed between the first active layer 1211 and the second gate electrode 1216. Therefore, the second gate electrode 1216 and the first active layer 1211 can be isolated from each other, thereby preventing the second gate electrode 1216 from directly in contact with the first active layer 1211 and affecting control of turning on and off of the first thin film transistor 121.

Wherein, the second gate electrode 1216 is disposed on the side of the first active layer 1211 adjacent to the substrate 110, which allows the second gate electrode 1216 and the first gate electrode 1214 to form a double-gate structure, and the second gate electrode 1216 can have an effective static-shielding effect between the first gate electrode 1214 and the first drain electrode 1213b. Therefore, a feedback capacitance between the first gate electrode 1214 and the first drain electrode 1213b is greatly reduced, and carrier mobility of the first thin film transistor 121 is improved.

In addition, the second gate electrode 1216 is disposed opposite to the first active layer 1211, so the second gate electrode 1216 can also play a role of a light shielding metal layer 124 at a same time, which shields ambient light to prevent the ambient light from irradiating on the first active layer 1211 and affecting a structure of the first active layer 1211, so overall structural stability of the first thin film transistor 121 can be further improved.

It should be noted that the second gate electrode 1216 may also be disposed on one side of the first active layer 1211 away from the substrate 110. That is, the second gate electrode 1216 and the first gate electrode 1214 are disposed on a same side of the first active layer 1211, and the second gate electrode 1216 and the first gate electrode 1214 can still form the double-gate structure to improve the carrier mobility of the first thin film transistor 121. In addition, in order to prevent the ambient light from affecting the structure of the first active layer 1211, one light shielding metal layer 124 may be formed on the substrate 110 corresponding to the first active layer 1211, thereby ensuring the overall structural stability of the first thin film transistor 121.

Optionally, the array substrate 100 includes a second thin film transistor 122 disposed in parallel with the first thin film transistor 121 on the substrate 110. Diversity of driving control of the array substrate 100 can be improved by designs of coordination among various thin film transistors, thereby satisfying different control requirements of other functional layer structures disposed on the array substrate 100.

Wherein, the second thin film transistor 122 includes a second active layer 1221, the first gate insulating layer 1212, and a second source and drain electrode layer 1226 disposed in a stack on the substrate 110. The first gate insulating layer 1212 is disposed between the second active layer 1221 and the second source and drain electrode layer 1226 to separate the second active layer 1221 from the second source and drain electrode layer 1226, thereby being convenient for a design of connecting the second source and drain electrode layer 1226 to the second active layer 1221.

It should be noted that the second active layer 1221, the first gate insulating layer 1212, and the second source and drain electrode layer 1226 are disposed in sequence in the direction away from the substrate 110, or the second source and drain electrode layer 1226, the first gate insulating layer 1212, and the second active layer 1221 are disposed in sequence in the direction away from the substrate 110. That is, positions of the second active layer 1221 and the second source and drain electrode layer 1226 relative to the substrate 110 may be exchanged, and a specific setting method can be adjusted according to actual design requirements.

Wherein, the second source and drain electrode layer 1226 includes a second source electrode 1226a and a second drain electrode 1226b electrically connected to the second active layer 1221. Turning on and off of the second active layer 1221 that is connected between the second source electrode 1226a and the second drain electrode 1226b can be realized by electrically connecting the second source electrode 1226a and the second drain electrode 1226b to the second active layer 1221 and adjusting driving voltages of the second source electrode 1226a and the second drain electrode 1226b, thereby realizing controlling other functional layer structures disposed on the array substrate 100.

Optionally, the second source and drain electrode layer 1226 is disposed on the same layer as the first source and drain electrode layer 1213 and the first gate electrode 1214. That is, the second source and drain electrode layer 1226, the first source and drain electrode layer 1213, and the first gate electrode 1214 are disposed on the same layer, that is, the second source electrode 1226a, the second drain electrode 1226b, the first source electrode 1213a, the first drain electrode 1213b, and the first gate electrode 1214 are disposed on the same layer. This structural setting method allows the second source electrode 1226a, the second drain electrode 1226*b*, the first source electrode 1213*a*, the first drain electrode 1213*b*, and the first gate electrode 1214 can be manufactured at the same time by the same mask during the manufacturing process. Therefore, the manufacturing process of the array substrate 100 can be simplified, the production efficiency can be improved, and the production costs can be reduced.

Optionally, the first gate insulating layer 1212 corresponding to the first source electrode 1213*a* is defined with a second via 1212*b*, the second via 1212*b* exposes the second active layer 1221, and the first source electrode 1213*a* is electrically connected to the second active layer 1221 by the second via 1212*b*. At a same time, positions of the first gate insulating layer 1212 corresponding to the first source electrode 1213*a* and the first drain electrode 1213*b* are defined with third vias 1212*c*, and the first source electrode 1213*a* and the first drain electrode 1213*b* are electrically connected to the first active layer 1211 by the third vias 1212*c*. Positions of the first gate insulating layer 1212 corresponding to the second source electrode 1226*a* and the second drain electrode 1226*b* are defined with fourth vias 1212*d*, and the second source electrode 1226*a* and the second drain electrode 1226*b* are electrically connected to the second active layer 1221 by the fourth vias 1212*d*. Therefore, an electrical connection between the first thin film transistor 121 and the second thin film transistor 122 can be realized, thereby facilitating coordinated control of other functional layer structures disposed on the array substrate 100.

Optionally, the second thin film transistor 122 includes a third gate electrode 1223 and a second gate insulating layer 1222. Wherein, the third gate electrode 1223 is disposed corresponding to the second active layer 1221, and the second gate insulating layer 1222 is disposed between the third gate electrode 1223 and the second active layer 1221 to separate the third gate electrode 1223 from the second active layer 1221, thereby preventing the third gate electrode 1223 from directly in contact with the second active layer 1221 and affecting control of turning on and off of the second thin film transistor 122.

In some embodiments, the third gate electrode 1223 is disposed on one side of the second active layer 1221 away from the substrate 110. By adjusting a driving voltage of an input terminal of the third gate electrode 1223, control of conduction or disconnection between the second source electrode 1226*a* and the second drain electrode 1226*b* can be realized, thereby realizing control of conduction or disconnection of the second thin film transistor 122.

Since the third gate electrode 1223 is disposed on the side of the second active layer 1221 away from the substrate 110, the ambient light may irradiate on the second active layer 1221 through the substrate 110 and then affects the structure of the second active layer 1221. Therefore, it is necessary to dispose the light shielding metal layer 124 on the side of the second active layer 1221 adjacent to the substrate 110 to prevent the second active layer 1221 from being irradiated by the ambient light and having structural changes, so structural stability of the second thin film transistor 122 can be ensured.

In another embodiments, the third gate electrode 1223 is disposed on the side of the second active layer 1221 adjacent to the substrate 110. At this time, the third gate electrode 1223 can not only control the conduction or disconnection between the second source electrode 1226*a* and the second drain electrode 1226*b*, but also can play the role of the light shielding metal layer 124, thereby protecting the second active layer 1221 and ensuring the structural stability of the second thin film transistor 122.

Optionally, the third gate electrode 1223 and the second gate electrode 1216 may be disposed on the same layer, that is, the third gate electrode 1223 and the second gate electrode 1216 belong to a same metal layer. This structural setting method allows the third gate electrode 1223 and the second gate electrode 1216 can be manufactured at the same time by the same mask during the manufacturing process. Therefore, the manufacturing process of the array substrate 100 can be simplified, the production efficiency can be improved, and the production costs can be reduced.

In some embodiments, the third gate electrode 1223 and the first source and drain electrode layer 1213 may also be disposed on the same layer, that is, the third gate electrode 1223, the second source electrode 1226*a*, the second drain electrode 1226*b*, the first source electrode 1213*a*, the first drain electrode 1213*b*, and the first gate electrode 1214 all belong to the same metal layer. Therefore, the manufacturing process of the array substrate 100 can be further simplified, the production efficiency can be improved, and the production costs can be reduced.

Optionally, the second thin film transistor 122 further includes a fourth gate electrode 1225 and a third gate insulating layer 1224, the third gate insulating layer 1224 is disposed between the third gate electrode 1223 and the fourth gate electrode 1225, and the fourth gate electrode 1225 is disposed corresponding to the second active layer 1221. The second thin film transistor 122 can form a double-gate structure by disposing the fourth gate electrode 1225, thereby improving the carrier mobility of the second thin film transistor 122.

Wherein, when the third gate electrode 1223 and the fourth gate electrode 1225 are both disposed on the side of the second active layer 1221 away from the substrate 110, it is necessary to dispose the light shielding metal layer 124 on the side of the second active layer 1221 adjacent to the substrate 110 to ensure the structural stability of the second thin film transistor 122. When at least one of the third gate electrode 1223 or the fourth gate electrode 1225 is disposed on the side of the second active layer 1221 adjacent to the substrate 110, the at least one can play the role of the light shielding metal layer 124 at the same time, so the disposition of the light shielding metal layer 124 can be omitted, thereby simplifying overall structure of the array substrate 100.

Optionally, in the embodiments, a material of the first active layer 1211 includes one or more of indium gallium zinc oxide, indium tin oxide, or indium zinc oxide, and a material of the second active layer 1221 includes low temperature polysilicon. That is, the first thin film transistor 121 is a metal oxide thin film transistor, and the second thin film transistor 122 is a low temperature polysilicon (LTPS) thin film transistor.

Wherein, low temperature polysilicon thin film transistors have advantages of high mobility, small sizes, fast charging, and fast switching speeds, so they have good effects when used to drive gate electrodes. Metal oxide thin film transistors have advantages of good uniformity and low leakage currents and may be used to drive display pixels. Therefore, by using the low temperature polysilicon thin film transistors and the metal oxide thin film transistors to form mixed thin film transistor structures, driving currents in gate driving circuits of display devices can be increased, and leakage currents generated when driving the display pixels of the display devices can also be reduced, thereby improving applicability of the array substrate 100.

Second, an embodiment of the present disclosure further provides a display panel. The display panel includes the array substrate. A specific structure of the array substrate can refer to the above embodiments. Since the display panel adopts all technical solutions of all the foregoing embodiments, it has at least all the beneficial effects brought about by the technical solutions of the foregoing embodiments, and will not be repeated herein.

Figure 2:
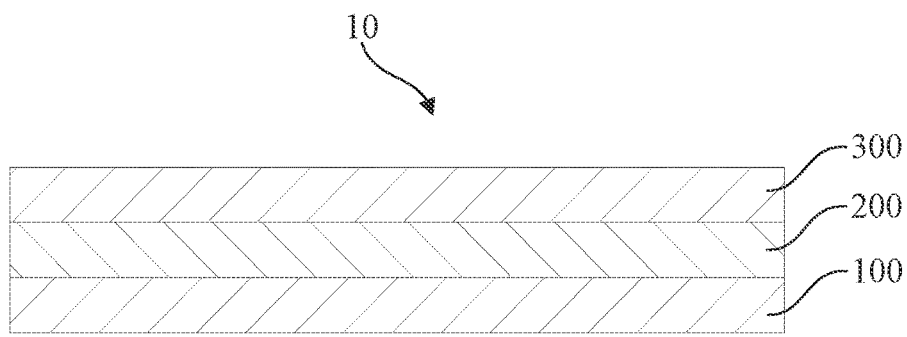
FIG. 2 is a schematic structural diagram of a display panel according to an embodiment of the present disclosure.

FIG. 2 is a schematic structural diagram of the display panel according to an embodiment of the present disclosure. As shown in FIG. 2, the display panel 10 includes the array substrate 100, a light-emitting device 200, and an encapsulating component 300. Wherein, the light-emitting device 200 is disposed on the array substrate 100, and the encapsulating component 300 is disposed on the light-emitting device 200.

Wherein, the light-emitting device 200 includes a plurality of light-emitting pixels, the array substrate 100 includes a plurality of first thin film transistors 121 and a plurality of second thin film transistors 122, and the light-emitting pixels are electrically connected to corresponding first thin film transistors 121 and second thin film transistors 122. By connection designs of the first thin film transistor 121 and the second thin film transistor 122 and adjustment of conduction or disconnection of the first thin film transistor 121 and the second thin film transistor 122, controlling of light-emitting methods of the light-emitting pixels can be realized, so different display requirements of the display panel 10 can be realized, thereby improving the display effect of the display panel 10.

It should be noted that the display panel 10 in the embodiments of the present disclosure has a wide range of applications, including televisions, computers, mobile phones, various display and illuminating display devices such as foldable and rollable display screens, as well as wearable devices such as smart bracelets and smart watches, are all within the scope of the application fields of the display panel 10 in the embodiment of the present disclosure.

Figure 3:
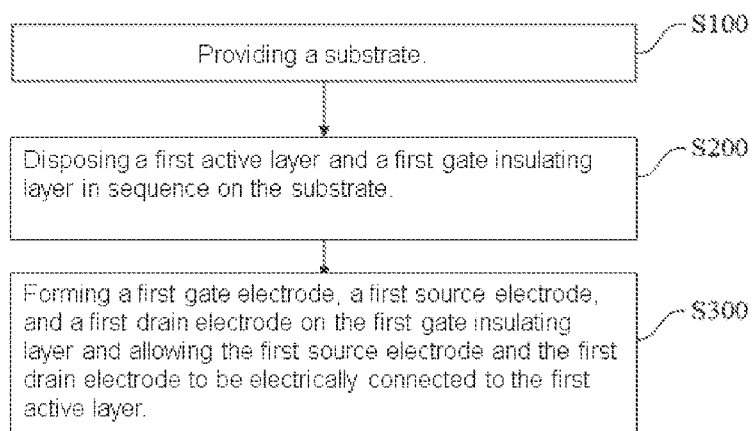
FIG. 3 is a flowchart of a manufacturing method of the array substrate according to an embodiment of the present disclosure.

Further, an embodiment of the present disclosure provides a manufacturing method of the array substrate. As shown in FIG. 3, the manufacturing method of the array substrate includes following steps.

S100: providing the substrate 110. The substrate 110 is used as a supporting structure in the array substrate 100 to support other film structures on the array substrate 100, thereby maintaining relative stability of the array substrate 100. Wherein, the substrate 110 may be a glass substrate, a hard substrate of other materials, or a flexible substrate, and is not limited herein.

S200: disposing the first active layer 1211 and the first gate insulating layer 1212 in sequence on the substrate 110.

As shown in FIG. 5, after cleaning the substrate 110, the first active layer 1211 is deposited on the substrate 110 first, and then is etched according to design requirements to form target patterns. The material of the first active layer 1211 includes one or more of indium gallium zinc oxide, indium tin oxide, or indium zinc oxide, that is, the first active layer 1211 is a metal oxide semiconductor.

Wherein, a thickness of the first active layer 1211 is greater than or equal to 400 angstroms, and is less than or equal to 1000 angstroms. If the thickness of the first active layer 1211 is too small, the carrier mobility of the first active layer 1211 may be affected, thereby affecting overall performance of the array substrate 100. If the thickness of the first active layer 1211 is overly large, an overall thickness of the array substrate 100 will be too large, which is not beneficial to a structural design of the array substrate 100.

In actual manufacturing processes, the thickness of the first active layer 1211 may be 400 angstroms, 600 angstroms, 800 angstroms, 1000 angstroms, etc., and a specific thickness thereof can be adjusted according to actual design requirements, which is not specifically limited herein.

After the first active layer 1211 is formed, the first gate insulating layer 1212 is needed to form on a surface of the first active layer 1211, and the first gate insulating layer 1212 covers the first active layer 1211 and the substrate 110. On one hand, the first gate insulating layer 1212 can isolate the first active layer 1211 to facilitate designs of the connection between subsequent film layers and the first active layer 1211. On another hand, the first gate insulating layer 1212 can planarize the surface of the first active layer 1211 to facilitate effective production of the subsequent film layers.

A material of the first gate insulating layer 1212 includes one or more of silicon oxide, silicon nitride, or silicon oxynitride. A thickness of the first gate insulating layer 1212 is greater than or equal to 1000 angstroms, and is less than or equal to 5000 angstroms, which can ensure the first gate insulating layer 1212 to have sufficient ability of physical insulation and electrical insulation, and at a same time, can prevent the thickness of the first gate insulating layer 1212 from being overly large and causing the overall thickness of the array substrate 100 to be overly large, thereby facilitating overall structural design of the array substrate 100.

S300: forming the first gate electrode 1214, the first source electrode 1213a, and the first drain electrode 1213b on the first gate insulating layer 1212 and allowing the first source electrode 1213a and the first drain electrode 1213b to be electrically connected to the first active layer 1211.

As shown in FIG. 6, after separating the first active layer 1211 by the first gate insulating layer 1212, it needs to form the first gate electrode 1214, the first source electrode 1213a, and the first drain electrode 1213b on the first gate insulating layer 1212. Since the first gate electrode 1214, the first source electrode 1213a, and the first drain electrode 1213b are all conductive structures, when materials used are the same, the first gate electrode 1214, the first source electrode 1213a, and the first drain electrode 1213b may be made at the same time using the same mask. At this time, the first gate electrode 1214, the first source electrode 1213a, and the first drain electrode 1213b are in the same layer, which is beneficial to simplify the manufacturing process of the array substrate 100, thereby improving the production efficiency of the array substrate 100.

The first active layer 1211, the first gate insulating layer 1212, the first gate electrode 1214, the first source electrode 1213a, and the first drain electrode 1213b together form the first thin film transistor 121. Since the material of the first active layer 1211 includes one or more of indium gallium zinc oxide, indium tin oxide, or indium zinc oxide, so the first thin film transistor 121 is a metal oxide thin film transistor.

It should be noted that during the process of forming the first gate insulating layer 1212, by defining the third vias 1212c on the first gate insulating layer 1212 corresponding to the first active layer 1211, the third vias 1212c expose a part of the first active layer 1211, and when the first source electrode 1213a and the first drain electrode 1213b are formed, the first source electrode 1213a and the first drain electrode 1213b will be filled in corresponding third vias 1212c, respectively, thereby realizing electrical connections between the first source electrode 1213a and the first active layer 1211 and between the first drain electrode 1213b and the first active layer 1211.

In the embodiments, the manufacturing method of the array substrate 100 includes the steps of disposing the first active layer 1211 and the first gate insulating layer 1212 in sequence on the substrate 110, then forming the first gate electrode 1214, the first source electrode 1213a, and the first drain electrode 1213b on the first gate insulating layer 1212, and then allowing the first source electrode 1213a and the first drain electrode 1213b to be electrically connected to the first active layer 1211. By forming the first gate electrode 1214, the first source electrode 1213a, and the first drain electrode 1213b on the first gate insulating layer 1212 at the same time, the first gate electrode 1214, the first source electrode 1213a, and the first drain electrode 1213b are allowed to be in the same layer. Therefore, a mask that is independently used to manufacture the first gate electrode 1214 can be omitted, thereby simplifying the manufacturing process of the array substrate 100, improving the production efficiency, and reducing the production costs.

Figure 4:
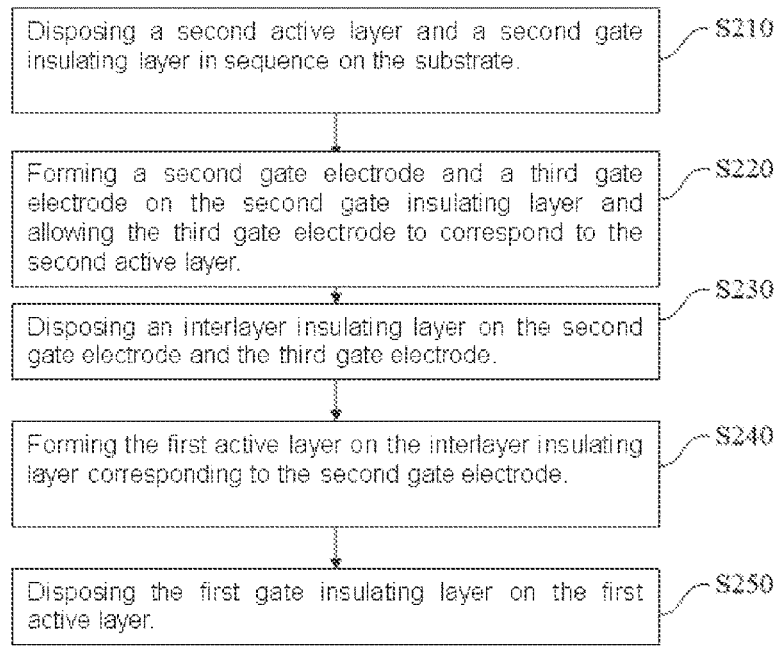
FIG. 4 is a flowchart of a step S200 in FIG. 3 according to an embodiment of the present disclosure.

Optionally, as shown in FIG. 4, the step of S200: disposing the first active layer 1211 and the first gate insulating layer 1212 in sequence on the substrate 110 mainly includes following steps.

S210: disposing the second active layer 1221 and the second gate insulating layer 1222 in sequence on the substrate 110.

After cleaning the substrate 110, the second active layer 1221 is deposited on the substrate 110 first, and then is etched according to design requirements to form target patterns. The material used for the second active layer 1221 includes low temperature polysilicon, that is, the second active layer 1221 is a low temperature polysilicon semiconductor.

After the second active layer 1221 is formed, the second gate insulating layer 1222 is needed to form on a surface of the second active layer 1221, and the second gate insulating layer 1222 covers the second active layer 1221 and the substrate 110. On one hand, the second gate insulating layer 1222 can isolate the second active layer 1221 to facilitate designs of the connection between subsequent film layers and the second active layer 1221. On another hand, the second gate insulating layer 1222 can planarize the surface of the second active layer 1221 to facilitate effective production of the subsequent film layers.

A material of the second gate insulating layer 1222 includes one or more of silicon oxide, silicon nitride, or silicon oxynitride. A thickness of the second gate insulating layer 1222 is greater than or equal to 1000 angstroms, and is less than or equal to 5000 angstroms, which can ensure the second gate insulating layer 1222 to have sufficient ability of physical insulation and electrical insulation, and at a same time, can prevent the thickness of the second gate insulating layer 1222 from being overly large and causing the overall thickness of the array substrate 100 to be overly large, thereby facilitating overall structural design of the array substrate 100.

S220: forming the second gate electrode 1216 and the third gate electrode 1223 on the second gate insulating layer 1222 and allowing the third gate electrode 1223 to correspond to the second active layer 1221.

After forming the second gate insulating layer 1222, a metal layer is deposited on the second gate insulating layer 1222, and then the metal layer is etched according to design requirements to form the third gate electrode 1223 on a position corresponding to the second active layer 1221, thereby facilitating a structural design of thin film transistor corresponding to the second active layer 1221.

While etching the metal layer, the second gate electrode 1216 is formed on the second gate insulating layer 1222. The second gate electrode 1216 corresponds to another thin film transistor, and a specific disposed position thereof may be adjusted according to disposition requirements of the thin film transistor. Just make sure that the second gate electrode 1216 and the third gate electrode 1223 are in the same metal layer, and the second gate electrode 1216 and the third gate electrode 1223 can be formed at the same time by the same mask. Therefore, the manufacturing process of the array substrate 100 can be simplified, the production efficiency can be improved, and the production costs can be reduced.

S230: disposing the interlayer insulating layer 1217 on the second gate electrode 1216 and the third gate electrode 1223.

After patterning and etching to form the second gate electrode 1216 and the third gate electrode 1223, the interlayer insulating layer 1217 is needed to be deposited on the second gate electrode 1216 and the third gate electrode 1223, and the interlayer insulating layer 1217 covers the second gate electrode 1216, the third gate electrode 1223, and the second gate insulating layer 1222. On one hand, the interlayer insulating layer 1217 can separate the second gate electrode 1216 from the third gate electrode 1223 to facilitate designs of the connection among subsequent film layers, the second gate electrode 1216, and the third gate electrode 1223. On another hand, the interlayer insulating layer 1217 can planarize the surface of the second gate electrode 1216 and the third gate electrode 1223 to facilitate effective production of the subsequent film layers.

A material of the interlayer insulating layer 1217 includes one or more of silicon oxide, silicon nitride, or silicon oxynitride. A thickness of the interlayer insulating layer 1217 is greater than or equal to 1000 angstroms, and is less than or equal to 5000 angstroms, which can ensure the interlayer insulating layer 1217 to have sufficient ability of physical insulation and electrical insulation, and at a same time, can prevent the thickness of the interlayer insulating layer 1217 from being overly large and causing the overall thickness of the array substrate 100 to be overly large, thereby facilitating overall structural design of the array substrate 100.

S240: forming the first active layer 1211 on the interlayer insulating layer 1217 corresponding to the second gate electrode 1216.

After forming the interlayer insulating layer 1217, the first active layer 1211 is deposited on the interlayer insulating layer 1217 and then is etched to form target patterns, and the first active layer 1211 is allowed to correspond to the second gate electrode 1216. Wherein, the first active layer 1211 and the second gate electrode 1216 correspond to a same thin film transistor, and the first active layer 1211 and the second gate electrode 1216 are disposed corresponding to each other, which is beneficial to the structural design of the thin film transistor.

S250: disposing the first gate insulating layer 1212 on the first active layer 1211.

After patterning to form the first active layer 1211, the first gate insulating layer 1212 is needed to form on the surface of the first active layer 1211 to allow the first gate insulating layer 1212 to cover the first active layer 1211 and the interlayer insulating layer 1217. On one hand, the first gate insulating layer 1212 can isolate the first active layer 1211 to facilitate designs of the connection between subsequent film layers and the first active layer 1211. On another hand, the first gate insulating layer 1212 can planarize the surface of the first active layer 1211 to facilitate effective production of the subsequent film layers.

Optionally, the step S300 of forming the first gate electrode 1214, the first source electrode 1213*a*, and the first drain electrode 1213*b* on the first gate insulating layer 1212 includes a following step:

forming the first gate electrode 1214, the first source electrode 1213*a*, the first drain electrode 1213*b*, a second source electrode 1226*a*, and a second drain electrode 1226*b* on the first gate insulating layer 1212, allowing the first source electrode 1213*a* and the first drain electrode 1213*b* to be electrically connected to the first active layer 1211, and allowing the first source electrode 1213*a*, the second source electrode 1226*a*, and the second drain electrode 1226*b* to be electrically connected to the second active layer 1221.

Wherein, the second active layer 1221, the second gate insulating layer 1222, the third gate electrode 1223, the first gate insulating layer 1212, the second source electrode 1226*a*, and the second drain electrode 1226*b* form the second thin film transistor 122. Since the material of the second active layer 1221 includes low temperature polysilicon, so the second thin film transistor 122 is a low temperature polysilicon thin film transistor.

It should be noted that during the process of forming the first gate insulating layer 1212, by defining the third vias 1212*c* on the first gate insulating layer 1212 corresponding to the first active layer 1211, the third vias 1212*c* expose a part of the first active layer 1211, thereby facilitating electrical connections between the first source electrode 1213*a* and the first active layer 1211 and between the first drain electrode 1213*b* and the first active layer 1211. The first gate insulating layer 1212 corresponding to the second active layer 1221 is etched to form the fourth vias 1212*d*, the fourth vias 1212*d* expose a part of the second active layer 1221, thereby facilitating electrical connections between the second source electrode 1226*a* and the second active layer 1221 and between the second drain electrode 1226*b* and the second active layer 1221.

In addition, the first gate insulating layer 1212 corresponding to the second active layer 1221 is further etched to form the second via 1212*b*, and the first source electrode 1213*a* is electrically connected to the second active layer 1221 by the second via 1212*b*. That is, the first source electrode 1213*a* is electrically connected to the first active layer 1211 and the second active layer 1221 at the same time, thereby realizing the electrical connection between the first thin film transistor 121 and the second thin film transistor 122 and facilitating coordinated control of other functional layer structures disposed on the array substrate 100.

Specifically, when forming the first gate electrode 1214, the first source electrode 1213*a*, the first drain electrode 1213*b*, the second source electrode 1226*a*, and the second drain electrode 1226*b* on the first gate insulating layer 1212, a metal layer is deposited on the first gate insulating layer 1212 first, and then the metal layer is etched according to requirements of target pattern designs to form the first gate electrode 1214, the first source electrode 1213*a*, the first drain electrode 1213*b*, the second source electrode 1226*a*, and the second drain electrode 1226*b* on the first gate insulating layer 1212 at the same time. Therefore, unnecessary photomask processes can be omitted, the manufacturing process of the array substrate 100 can be simplified, and the production efficiency can be improved.

Since the first gate electrode 1214, the first source electrode 1213*a*, and the first drain electrode 1213*b* belong to the first thin film transistor 121 and they are located relatively close to each other, in order to ensure that the first gate electrode 1214 is completely separated from the first source electrode 1213*a* and the first drain electrode 1213*b*, when the metal layer is etched at the same time that the gaps 1215 are formed among the first gate electrode 1214, the first source electrode 1213*a*, and the first drain electrode 1213*b*, the first gate insulating layer 1212 corresponding to the gaps 1215 will be further etched to form the first vias 1212*a*, thereby ensuring that the first gate electrode 1214 is completely separated from the first source electrode 1213*a* and the first drain electrode 1213*b*. Incomplete etching caused by etching accuracy or etching depths during the manufacturing process of the array substrate 100, which makes interference occur between the first gate electrode 1214 and the first source electrode 1213*a* and the first drain electrode 1213*b*, can be prevented, thereby ensuring structural stability of the first thin film transistor 121.

Optionally, the manufacturing method of the array substrate 100 in the embodiment further includes a following step: disposing the planarization layer 123 on the first gate electrode 1214, the first source electrode 1213*a*, the first drain electrode 1213*b*, the second source electrode 1226*a*, and the second drain electrode 1226*b*. The planarization layer 123 covers the first gate insulating layer 1212 and fills the gaps 1215 among the first gate electrode 1214, the first source electrode 1213*a*, and the first drain electrode 1213*b*, and the first vias 1212*a* on the first gate insulating layer 1212. By disposing the planarization layer 123, a surface of the array substrate 100 can be flattened to facilitate connection between the array substrate 100 and subsequent functional layer structures, and electrical insulation between the first gate electrode 1214, and the first source electrode 1213*a* and the first drain electrode 1213*b* can be improved, thereby preventing mutual interference, and improving the structural stability of the first thin film transistor 121.

Optionally, during the manufacturing process of the array substrate 100, in order to improve the structural stability of the array substrate 100, after cleaning the substrate 110, the light shielding metal layer 124 is directly disposed on the surface of the substrate 110, and then the buffer layer 125 is disposed on the light shielding metal layer 124.

A disposed position of the light shielding metal layer 124 may be adjusted according to a target disposed position of corresponding thin film transistor, and it is only necessary to make the light shielding metal layer 124 correspond to corresponding first active layer 1211 and second active layer 1221. Disposing the light shielding metal layer 124 on the substrate 110 can prevent the ambient light from irradiating on the first active layer 1211 and the second active layer 1221 through the substrate 110, thereby ensuring structural stability of the first active layer 1211 and the second active layer 1221.

The disposition of the buffer layer 125 can separate the light shielding metal layer 124 from the subsequent film layers, thereby preventing mutual interference. At the same time, the buffer layer 125 can also planarize the surface of the light shielding metal layer 124 to facilitate effective formation of the subsequent film layers.

It should be noted that in the manufacturing process of the array substrate 100, each metal film layer in the embodiment of the present disclosure, which includes the first gate electrode 1214, the second gate electrode 1216, the first source electrode 1213*a*, and the first drain electrode 1213*b* of the first thin film transistor 121 and the third gate electrode 1223, the fourth gate electrode 1225, the second source electrode 1226*a*, and the second drain electrode 1226*b* of the second thin film transistor 122, can cooperate with each other to be manufactured by a same layer production method under the premise that the manufacturing process is feasible. Therefore, a maximum number of masks can be omitted, the manufacturing process of the array substrate 100 can be simplified, and the production efficiency can be improved.

Both the first thin film transistor 121 and the second thin film transistor 122 may be a bottom gate structure or a top gate structure. According to design requirements of actual structures, positions of corresponding gate electrodes may be adjusted. When relative positions of the first gate electrode 1214, second gate electrode 1216, third gate electrode 1223, and fourth gate electrode 1225 are changed, corresponding manufacturing processes can also be changed accordingly, and gate electrode structures disposed in the same layer by a same mask can also be changed accordingly. It only needs to ensure that under the premise that structure design requirements of the array substrate 100 are satisfied, the number of masks can be omitted, the manufacturing process of the array substrate 100 can be simplified, the production efficiency of the array substrate 100 can be improved, and the production costs can be reduced.

The array substrate, the display panel, and the manufacturing method of the array substrate provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. An array substrate, comprising:
   a substrate; and
   a thin film transistor layer disposed on the substrate;
   wherein the thin film transistor layer comprises a first thin film transistor, and the first thin film transistor comprises a first active layer, a first gate insulating layer, and a first source and drain electrode layer disposed in a stack on the substrate;
   the first gate insulating layer is disposed between the first active layer and the first source and drain electrode layer, and the first source and drain electrode layer comprises a first source electrode and a first drain electrode electrically connected to the first active layer; and
   the first thin film transistor further comprises a first gate electrode disposed on the first gate insulating layer, and the first gate electrode and the first source and drain electrode layer are disposed on a same layer;
   wherein the first thin film transistor further comprises a second gate electrode and an interlayer insulating layer, the second gate electrode is disposed on one side of the first active layer adjacent to the substrate, and the interlayer insulating layer is disposed between the first active layer and the second gate electrode.

2. The array substrate according to claim 1, wherein the first active layer, the first gate insulating layer, and the first source and drain electrode layer are disposed in sequence in a direction away from the substrate.

3. The array substrate according to claim 1, wherein gaps are defined between the first gate electrode and the first source electrode and between the first gate electrode and the first drain electrode, and the first gate insulating layer corresponding to the gaps is defined with first vias.

4. The array substrate according to claim 3, further comprising a planarization layer disposed on the first source and drain electrode layer and the first gate electrode and filled in the gaps and the first vias.

5. The array substrate according to claim 1, further comprising a second thin film transistor disposed in parallel with the first thin film transistor on the substrate;
   wherein the second thin film transistor comprises a second active layer, the first gate insulating layer, and a second source and drain electrode layer disposed in a stack on the substrate;
   the first gate insulating layer is disposed between the second active layer and the second source and drain electrode layer, and the second source and drain electrode layer comprises a second source electrode and a second drain electrode electrically connected to the second active layer; and
   the second source and drain electrode layer, the first source and drain electrode layer, and the first gate electrode are disposed on the same layer.

6. The array substrate according to claim 5, wherein the second active layer, the first gate insulating layer, and the second source and drain electrode layer are disposed in sequence in a direction away from the substrate.

7. The array substrate according to claim 5, wherein the first gate insulating layer corresponding to the first source electrode is defined with a second via, the second via exposes the second active layer, and the first source electrode is electrically connected to the second active layer by the second via.

8. The array substrate according to claim 5, wherein the second thin film transistor comprises a third gate electrode and a second gate insulating layer, the third gate electrode is disposed corresponding to the second active layer, and the second gate insulating layer is disposed between the third gate electrode and the second active layer; and
   the third gate electrode is disposed on one side of the second active layer away from the substrate or on one side of the second active layer adjacent to the substrate.

9. The array substrate according to claim 8, further comprising a light shielding metal layer disposed on the side of the second active layer adjacent to the substrate.

10. The array substrate according to claim 8, wherein the third gate electrode is disposed on a same layer as the second gate electrode or with the first source and drain electrode layer.

11. The array substrate according to claim 8, wherein the second thin film transistor further comprises a fourth gate electrode and a third gate insulating layer, the third gate insulating layer is disposed between the third gate 30 electrode and the fourth gate electrode, and the fourth gate electrode is disposed corresponding to the second active layer.

12. The array substrate according to claim 11, wherein the third gate electrode and the fourth gate electrode are disposed on the side of the second active layer away from the substrate, or at least one of the third gate electrode or the fourth gate electrode is disposed on the side of the second active layer adjacent to the substrate.

13. The array substrate according to claim 5, wherein a material of the first active layer comprises one or more of indium gallium zinc oxide, indium tin oxide, or indium zinc oxide, and a material of the second active layer comprises low temperature polysilicon.

14. A display panel, comprising the array substrate according to claim 1.

15. A manufacturing method of an array substrate, comprising following steps:
providing a substrate;
disposing a first active layer and a first gate insulating layer in sequence on the substrate; and
forming a first gate electrode, a first source electrode, and a first drain electrode on the first gate insulating layer and allowing the first source electrode and the first drain electrode to be electrically connected to the first active layer, wherein the first active layer, the first gate insulating layer, the first gate electrode, the first source electrode, and the first drain electrode form a first thin film transistor;
wherein the step of disposing the first active layer and the first gate insulating layer in sequence on the substrate comprises following steps:
disposing a second active layer and a second gate insulating layer in sequence on the substrate;
forming a second gate electrode and a third gate electrode on the second gate insulating layer and allowing the third gate electrode to correspond to the second active layer;
disposing an interlayer insulating layer on the second gate electrode and the third gate electrode;
forming the first active layer on the interlayer insulating layer corresponding to the second gate electrode; and
disposing the first gate insulating layer on the first active layer.

16. The manufacturing method of the array substrate according to claim 15, wherein the step of forming the first gate electrode, the first source electrode, and the first drain electrode on the first gate insulating layer comprises following steps:
forming the first gate electrode, the first source electrode, the first drain electrode, a second source electrode, and a second drain electrode on the first gate insulating layer, allowing the first source electrode and the first drain electrode to be electrically connected to the first active layer, and allowing the first source electrode, the second source electrode, and the second drain electrode to be electrically connected to the second active layer, wherein the second active layer, the second gate insulating layer, the third gate electrode, the first gate insulating layer, the second source electrode, and the second drain electrode form a second thin film transistor.

17. The manufacturing method of the array substrate according to claim 16, further comprising a following step:
disposing a planarization layer on the first gate electrode, the first source electrode, the first drain electrode, the second source electrode, and the second drain electrode.

18. The manufacturing method of the array substrate according to claim 15, wherein before the step of disposing the second active layer and the second gate insulating layer in sequence on the substrate, the method further comprises following steps:
disposing a light shielding metal layer on the substrate; and
disposing a buffer layer on the light shielding metal layer.

* * * * *